(12) United States Patent
Hein et al.

(10) Patent No.: US 7,187,241 B2
(45) Date of Patent: Mar. 6, 2007

(54) CALIBRATION OF OSCILLATOR DEVICES

(75) Inventors: Jerrell Hein, Driftwood, TX (US);
Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 65 days.

(21) Appl. No.: 10/675,543

(22) Filed: Sep. 30, 2003

(65) Prior Publication Data

US 2004/0222856 A1  Nov. 11, 2004

Related U.S. Application Data

(60) Provisional application No. 60/467,813, filed on May 2, 2003.

(51) Int. Cl.
*H03L 7/00* (2006.01)

(52) U.S. Cl. .......................... 331/16; 331/44

(58) Field of Classification Search .............. 331/44, 331/16, 1 A, 107 A, 176, 70, 158; 327/156, 327/147; 375/376
See application file for complete search history.

(56) References Cited

U.S. PATENT DOCUMENTS

| | | |
|---|---|---|
| 3,676,801 A | 7/1972 | Musa |
| 3,719,838 A | 3/1973 | Peduto et al. |
| 3,887,941 A | 6/1975 | Dann et al. |
| 4,038,612 A | 7/1977 | Borofka et al. |
| 4,135,158 A | 1/1979 | Parmet |
| 4,380,745 A | 4/1983 | Barlow et al. |
| 4,446,446 A | 5/1984 | Fowks |
| 4,485,818 A | 12/1984 | Leckrone et al. |
| 4,580,107 A | 4/1986 | Caldwell et al. |
| 4,598,257 A | 7/1986 | Southard |
| 4,683,445 A | 7/1987 | Erickson |
| 4,689,581 A | 8/1987 | Talbot |
| 4,827,226 A | 5/1989 | Connell |
| 4,847,888 A | 7/1989 | Cox et al. |
| 4,859,968 A | 8/1989 | Gershon |
| 4,891,825 A | 1/1990 | Hansen |
| 4,931,748 A | 6/1990 | McDermott et al. |
| 4,940,950 A | 7/1990 | Helfrick |
| 4,967,165 A | 10/1990 | Lee et al. |
| 4,969,210 A | 11/1990 | Hansen et al. |
| 4,996,608 A | 2/1991 | Widney |
| 5,041,800 A | 8/1991 | Long et al. |
| 5,081,431 A | 1/1992 | Kubo et al. |
| 5,099,153 A | 3/1992 | Adams |
| 5,144,254 A | 9/1992 | Wilke |
| 5,179,359 A | 1/1993 | McLeod |

(Continued)

FOREIGN PATENT DOCUMENTS

EP  0 239 412 A2  9/1987

(Continued)

OTHER PUBLICATIONS

Cypress Semiconductor Corporation, "Cypress I PLL In-System Programmable Clock Generator with Individual 16K EEPROM," Dec. 14, 2002, 18 pages.

(Continued)

*Primary Examiner*—Joseph Chang
(74) *Attorney, Agent, or Firm*—Zagorin O'Brien Graham LLP

(57) ABSTRACT

A clock device having a resonating device such as a crystal of SAW supplying a controllable oscillator such as a digitally controlled oscillator is calibrated by supplying a calibration clock. A phase-locked loop is utilized to generate one or more correction factors causing the PLL to lock to the calibration clock. The one or more correction factors are then stored in non-volatile memory.

46 Claims, 5 Drawing Sheets

U.S. PATENT DOCUMENTS

| | | | |
|---|---|---|---|
| 5,180,992 | A | 1/1993 | Akiyama et al. |
| 5,233,351 | A | 8/1993 | Gregory et al. |
| 5,254,958 | A | 10/1993 | Flach et al. |
| 5,257,294 | A | 10/1993 | Pinto et al. |
| 5,259,007 | A | 11/1993 | Yamamoto |
| 5,263,197 | A | 11/1993 | Manjo et al. |
| 5,266,908 | A | 11/1993 | Kouloupoulos et al. |
| 5,319,324 | A | 6/1994 | Satoh et al. |
| 5,349,544 | A | 9/1994 | Wright et al. |
| 5,416,443 | A | 5/1995 | Cranford, Jr. et al. |
| 5,416,446 | A | 5/1995 | Holler, Jr. et al. |
| 5,428,319 | A | 6/1995 | Marvin et al. |
| 5,448,204 | A | 9/1995 | Gardner |
| 5,451,912 | A * | 9/1995 | Torode .................. 331/108 C |
| 5,471,661 | A | 11/1995 | Atkinson |
| 5,473,289 | A | 12/1995 | Ishizaki et al. |
| 5,473,758 | A | 12/1995 | Allen et al. |
| 5,485,127 | A | 1/1996 | Bertoluzzi et al. |
| 5,574,408 | A * | 11/1996 | Zwack ....................... 331/176 |
| 5,579,348 | A * | 11/1996 | Walker et al. .............. 375/355 |
| 5,604,468 | A | 2/1997 | Gillig |
| 5,781,054 | A | 7/1998 | Lee |
| 5,790,614 | A | 8/1998 | Powell |
| 5,952,890 | A | 9/1999 | Fallisgaard et al. |
| 6,008,703 | A | 12/1999 | Perrott et al. |
| 6,091,943 | A | 7/2000 | Nyenhuis |
| 6,404,246 | B1 | 6/2002 | Estakhri et al. |
| 6,456,164 | B1 | 9/2002 | Fan |
| 6,515,553 | B1 | 2/2003 | Filiol et al. |
| 6,570,453 | B2 | 5/2003 | Su et al. |
| 2002/0190764 | A1 | 12/2002 | Nichols |
| 2004/0232995 | A1* | 11/2004 | Thomsen et al. .............. 331/2 |
| 2004/0232997 | A1* | 11/2004 | Hein et al. .................... 331/16 |
| 2004/0246809 | A1* | 12/2004 | Sutardja ..................... 365/232 |

FOREIGN PATENT DOCUMENTS

| | | |
|---|---|---|
| EP | 0 393 975 A1 | 10/1990 |
| EP | 0 402 736 A2 | 12/1990 |
| EP | 0 601 780 A2 | 6/1994 |
| JP | 02-291161 | 11/1990 |
| JP | 03-297223 | 12/1991 |
| WO | WO 85/02966 | 7/1985 |

OTHER PUBLICATIONS

Encinas, J. B., "Phase Locked Loops," Chapman & Hall, 1993, pp. 144-158.

Foord, A., "Voltage Controlled Oscillator," Radio & Electronics Constructor, May 1975, pp. 590-595, 592-4.

Fox Electronics, "1995-1996 Frequency Control Products Catalog," Fort Meyers, Florida, 1995, 72 pages.

Fox Electronics, "F3000 / HCMOS/ITL Tri-State Enable/Disable Oscillator," 1 page (from file history of U.S. Patent No. 5,952,890).

Fox Electronics, "F6151 / Tri-State HCMOS Dual Programmable Clock Oscillator," 4 pages (from file history of U.S. Patent No. 5,952,890).

Fox Electronics, "F6053A / Tri-State HCMOS Programmable clock Oscillator," 4 pages (from file history of U.S. Patent No. 5,952,890).

Fox Electronics, "F6233 Quick Delivery Oscillator," 1 page (from file history of U.S. Patent No. 5,952,890).

Gardner, Floyd M., "Phaselock Techniques," Second Edition, John Wiley & Sons, 1979, pp. 2-5.

Gaskell, Tom, "Semiconductor Circuits Programmable Crystal Oscillator (PXO-600)," *Practical Electronics*, Jul. 1983, pp. 40-43.

Giles, T. G., "A Universal Frequency Synthesizer IC," Phillips Telecommunication Review, vol. 37, No. 3, Aug. 1979, pp. 177-181.

Goto, Junichi, et al., "A Programmable Clock Generator With 50 to 350 MHz Lock Range For Video Signal Processors," IEEE 1993 Custom Integrated Circuits Conference, pp. 4.4.1-4.4.2.

"IC Designs Introduces Trio of Parts Aimed at Replacing Crystal Oscillators in Personal Computer Graphics Board Designs," News Release, May 9, 1990, 1 page.

Hybrids International, Ltd., "Hybrids International Product Summary," Mar. 1993, Olathe, Kansas, 5 pages.

IC Designs, "Satellite Oscillator," Model No. ICD2031A Preliminary Data Sheet, V2.0, May 1991, pp. 1-8.

IC Designs, "Frequency Multiplier," Model No. ICD2032 Preliminary Data Sheet, V2.0, May 1991, pp. 1-7.

IC Designs, "Dual VGA Clock Generator," Model No. ICD2042A, prior to 1995, 1 page.

IC Designs, "Dual Programmable Clock Oscillator," Model No. ICD2051, V2.0, May 1991, pp. 1-12.

IC Designs, "Programmable Clock Oscillator," Model No. ICD2053A Programmable Products, V1.0, prior to 1995, pp. 14 pages.

IC Designs, "Graphics Frequency Synthesizers," Model No. ICD2061A, prior to 1995, 1 page.

IC Designs, "Dual Programmable ECL/TTL Clock Generator," Model No. ICD2062B, prior to 1995, 1 page.

IC Designs, "Programmable Graphics Clock Generator," Model No. ICD 2063, prior to 1995, 1 page.

IC Designs, Model No. ICD 6233, Specifications, Feb. 11, 1994, 32 pages.

IC Designs, "Application Note: Power Feed and Board Layout Issues," May 1991, 3 pages.

Lovelock, Peter A., "Build This Programmable Crystal-Controlled Pulse Generator," Radio Electronics, Jun. 1990, pp. 47-50.

MF Electronics Corp., "Crystal Controlled Oscillators 20 to 220 MHz Programmable ECL," prior to 1995, pp. 9, 11, 18-20.

Mielke, Erhard, "XP-002061415 Programmierbarer 50-MHz-Muttertaktimpulsgenerator," 2421 Radio Fernschen Elektronik 39 (1990) No. 9, Berlin, 4 pages.

Epson, "Programmable Multi-Output Crystal Oscillator MG-5010," Mar. 7, 1993, 3 pages.

Wenzel Associates, "Custom Oscillator Configurations," Austin, Texas, 1 page (from file history of U.S. Patent No. 5,952,890).

M-Tron, "MT1135 Series Dual Baud Rate Generators," 1987, 3 pages.

M-Tron, "MV Series VCXO Oscillators," prior to 1995, 1 page.

National Semiconductor, "PLL™ Low Power Frequency Synthesizer for RF Personal Communications," Advance Information, Jan. 1998, 18 pages.

Soderquist, Donn, "Digitally Programmed Oscillator is Suitable for µP Control," Precision Monolithics Inc., Jun. 21, 1997, pp. 102, 104.

Ooms, William J., "Improved Frequency Synthesizer," 8182 Motorol Technical Disclosure Bulletin, Oct. 1986, Schaumbourg, ILL, 3 pages.

Vectron Laboratories, "Stonet Clock Recovery Module 622.08 MHz," Model No. SCRM-622, 1994, 4 pages.

De Muer, Bram, and Steyaert, Michel S. J., "A CMOS Monolithic $\Delta\Sigma$-Controlled Fractional-$N$ Frequency Synthesizer for DCS-1800," IEEE Journal of Solid-State Circuits, vol. 37, No. 7, Jul. 2002, pp. 835-844.

Riley, Tom A. D., et al., "Delta-Sigma Modulation in Fractional-$N$ Frequency Synthesis," IEEE Journal of Solid-State Circuits, vol. 28, No. 5, May 1993, pp. 553-559.

Parmarti, Sudhakar, et al., "A Wideband 2.4-GHz Delta-Sigma Fractional-N PLL With 1-Mb/s In-Loop Modulation," IEEE Journal of Solid-State Circuits, vol. 39, No. 1, Jan. 2004, pp. 49-62.

* cited by examiner

CALIBRATION OF OSCILLATOR DEVICES

CROSS-REFERENCE TO RELATED APPLICATION(S)

This application claims benefit under 35 U.S.C. § 119(e) of application No. 60/467,813, filed May 2, 2003, which is incorporated herein by reference.

FIELD OF THE INVENTION

This application relates to oscillator devices such as VCXOs and XOs and more particularly to calibration of such devices.

DESCRIPTION OF THE RELATED ART

In the crystal oscillator (XO) and voltage controlled oscillator (VCXO) markets, standard low cost 4 or 6 pin XO and 6 pin VCXO packages having standard inputs/outputs (I/Os) are commonly used. In order to provide greater flexibility, some XO and VCXO devices include both an integrated circuit (IC) and a crystal (or surface acoustic wave (SAW) device), supplying a source frequency, in the package. In order to program and/or calibrate such XO or VCXO devices, some prior art approaches have used additional pins or contact points on the package to supply one or more programming parameters that determine the output frequency supplied by the XO or VCXO device. The use of extra package pins or contact points to provide programmability may require custom packages, which can result in additional package size, additional tooling and higher manufacturing costs. In addition, there may be a marketing disadvantage from using a non-standard package. Thus, for certain applications, additional package pins for programming may be undesirable. Other prior art techniques have utilized existing package pins for such programming.

In prior art devices, in order to program the output frequency, one or more parameter(s) are supplied to the XO or VCXO device, the output frequency is measured, and, if necessary, new parameters are supplied to adjust the output frequency. Such calibration can be time consuming. In addition, the parameter(s) appropriate for one crystal and semiconductor device pair may need to be adjusted for other crystal/semiconductor device pairs.

Rather than program through package pins, some prior art techniques use an open top package with additional connection points on the integrated circuit in order to calibrate the device prior to packaging. However, programming with an open lid on the package may not be desirable because after calibration with the open lid, the device characteristics can change after the lid is sealed, at least partially defeating the calibration efforts. If the device is not programmable at all, the inability to program a device means that the device lacks flexibility and calibration features.

Accordingly, it would be desirable to provide a flexible device for crystal oscillator (XO) and voltage controlled oscillator (VCXO) applications with improved programming and calibration capability.

SUMMARY

Accordingly, according to an embodiment of the invention, a device is provided for use in XO and VCXO applications that is calibrated by supplying a calibration clock to the device and having the device generate its own correction factors internally using a control loop such as a phase-locked loop configured to control the output clock of the controllable oscillator during calibration and cause the output clock to lock to a multiple of the calibration clock.

In one embodiment a method is provided that includes receiving a calibration clock over a terminal; generating at least one correction factor using a control loop to lock an output clock generated by a controllable oscillator to a multiple of the calibration clock; and storing a value corresponding to the at least one correction factor in a non-volatile memory.

In another embodiment, a method is provided for calibrating a device that includes a controllable oscillator and a resonating device that supplies a fixed reference frequency used by the controllable oscillator to synthesize an output clock, the controllable oscillator and the resonating device being mounted in a package. The method includes supplying a calibration clock to an input/output terminal of the device; generating a control value to cause the controllable oscillator to lock to a multiple of the calibration clock; and storing the control value in a non-volatile memory in the device.

In another embodiment, the invention provides a device that includes a controllable oscillator coupled to receive a reference frequency and a control value and to output a clock. A terminal of the device receives a calibration clock. A phase-locked loop circuit using the controllable oscillator is programmably provided and is coupled to receive the calibration clock and generate a correction factor to cause the controllable oscillator to lock a multiple of the calibration clock. A non-volatile memory stores the correction factor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
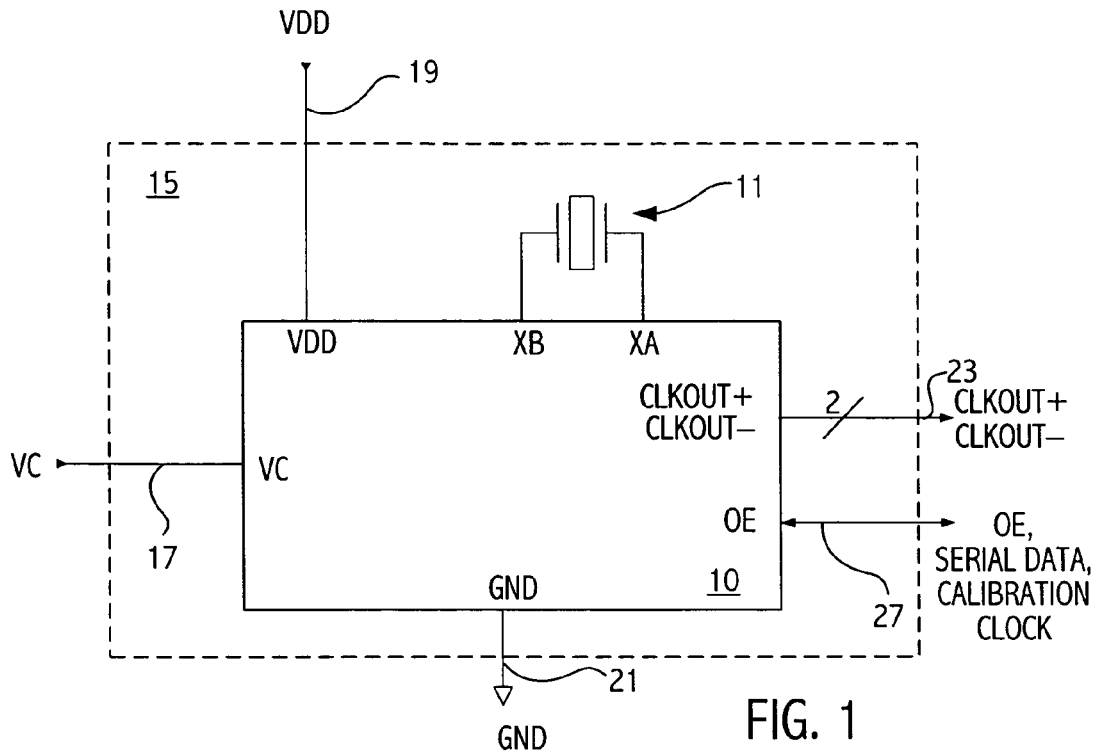
FIG. 1 illustrates a device according to an embodiment of the present invention having an integrated circuit and a crystal packaged in a standard six pin VCXO ceramic package.

Referring to FIG. 1, a high level block diagram of an embodiment of the invention includes an integrated circuit 10, described further herein, coupled to a crystal 11. Both the integrated circuit 10 and the crystal 11 are packaged in a standard ceramic package 15 that is typically utilized for packaging a voltage controlled crystal oscillator (VCXO). Typical packages sizes are 5×7 mm and 9×14 mm. In one embodiment the crystal used is a third overtone 116.64 MHz crystal. Note that another resonating device such as a surface acoustic wave (SAW) device may be utilized in place of crystal 11. The package 15 includes standard input/output signals including a voltage control input 17, a power and ground input, 19 and 21 respectively, clock out plus and minus 23 and an output enable terminal 27.

Figure 2:
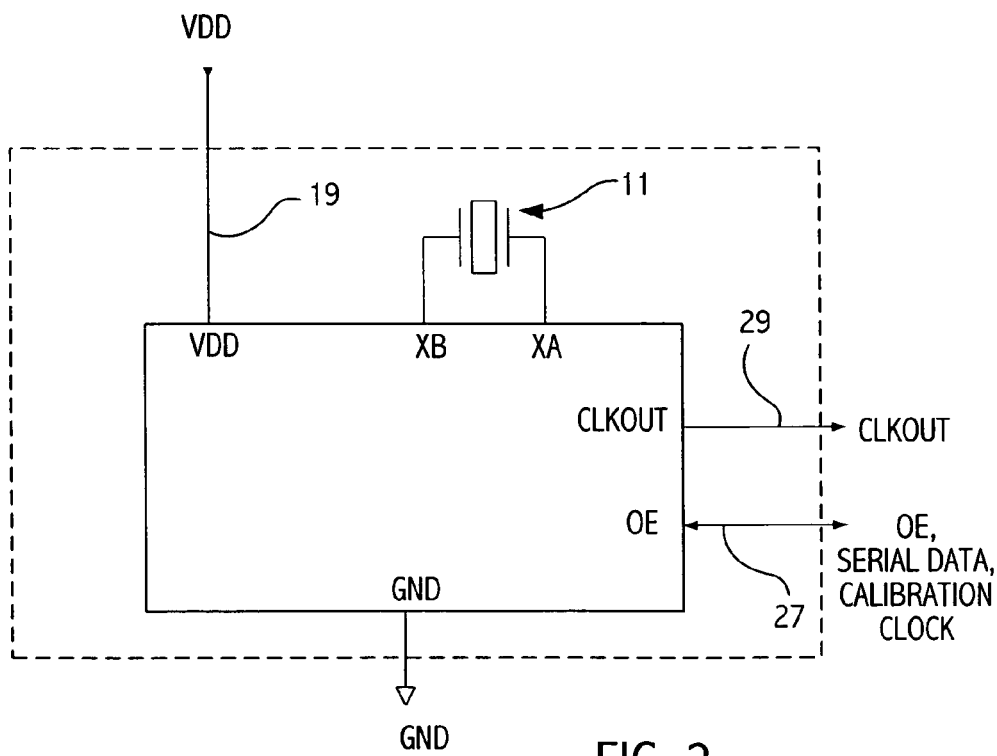
FIG. 2 illustrates a device according to an embodiment of the present invention having an integrated circuit and a crystal in a configuration in which they are packaged in a standard four pin XO ceramic package.

Referring to FIG. 2, a four pin XO package implementation is illustrated in which the control voltage input 17 is not utilized and the output clock 29 is single ended. In a six pin XO package configuration, the control voltage input on the package is not connected when the package 15 is mounted to a board.

Note that the terms "pin" and "terminal" as used herein are intended to refer to any kind of electrical connection provided on a package or integrated circuit such as a pin on a package or a contact pad on an integrated circuit. The term input/output (I/O) terminal (or pin) is intended to mean either a terminal that functions as an input, an output or both.

Table 1 shows industry standard input/output (I/O) for four pin and six pin XOs and six pin VCXOs. As can be seen from Table 1, there is one common static input in all of the packages—the Output Enable/Disable (OE) pin.

TABLE 1

| I/O | 4 PIN X0 | 6 PIN XO | 6 PINVCXO |
|---|---|---|---|
| 1 | Power | Power | Power |
| 2 | Ground | Ground | Ground |
| 3 | Clock Out | Clock Out + | Clock Out + |
| 4 | Output Enable/Disable | Clock Out − | Clock Out − |
| 5 | | No Connection | Control Voltage |
| 6 | | Output Enable/Disable | Output Enable/Disable |

In order to provide a more flexible clock device, according to an embodiment of the present invention, the OE pin 27 is multi-functional. That is, in one embodiment, the OE terminal functions as a normal enable signal causing the output clock(s) to be either supplied or not according to the voltage level on the OE terminal. In addition, according to an embodiment of the present invention, the OE terminal 27 is also used for programming and calibrating the device 10. In order to program the integrated circuit device, the OE terminal 27 is used to communicate serial data to and from the integrated circuit 10. Thus, in addition to normal disable functionality, in one embodiment of the invention, the OE pin 27 serves as a serial port for access to storage locations internal to integrated circuit 10, thus providing programmability. In an embodiment, the OE pin is bi-directional, implemented as an open drain with a weak pull-up. In some embodiments, the serial communication may be unidirectional into integrated circuit 10.

In addition, OE terminal 27 can function as a calibration input used to internally generate calibration correction factors using an internal PLL. The calibration input receives a calibration clock providing a frequency reference for calibration. The calibration clock feature is useful, e.g., so that the device can lock its output clock to the calibration clock using an internal PLL, and correction factors used to lock the PLL to the calibration clock can be stored for absolute output frequency and/or frequency versus temperature, as described further below.

Adapting the OE terminal to be multi-functional provides both programmability and calibration capability, and because a standard input terminal is utilized for the functions, no special packaging is required, resulting in low cost for the additional functionality. Significantly, the functions can be performed after the device is packaged and sealed. In addition, low frequency test equipment can be used to provide programming and calibration of the devices in a sealed package without any additional package pins.

Figure 3:
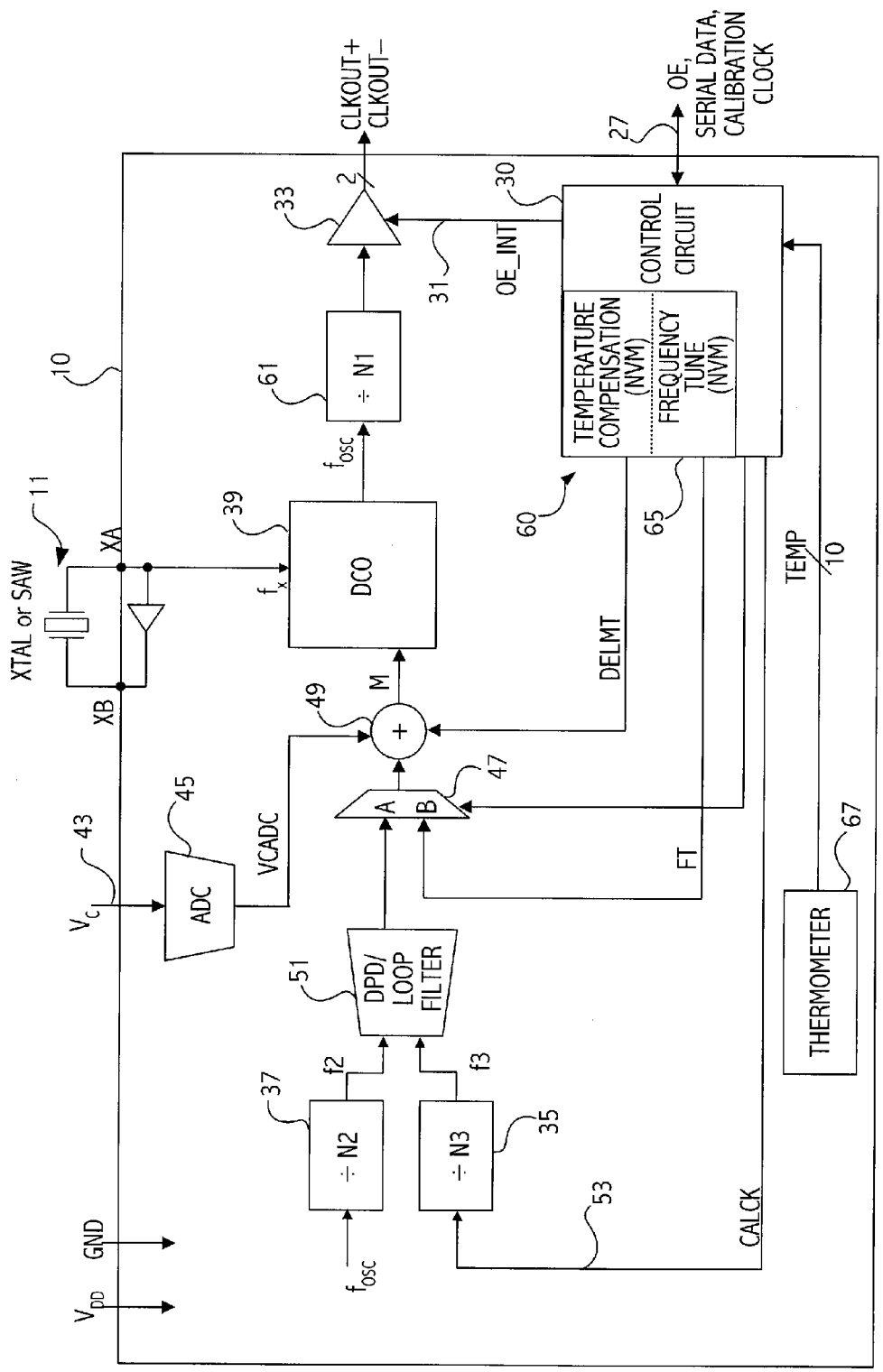
FIG. 3 illustrates an embodiment utilizing a multi-function output enable input/output terminal that provides a serial communication terminal and an input terminal for receiving a configuration clock.

Referring to FIG. 3, a block diagram illustrates an embodiment of integrated circuit 10 utilized in a six pin VCXO package implementation. In the illustrated embodiment, implementing the multi-functional OE terminal 27 is accomplished as follows. The output enable signal supplied from an external source to OE terminal 27 is provided to control circuit 30, which may include a sampling circuit and a state machine. The control circuit 30 determines whether the received signal is a valid output enable signal, serial data communication, or a calibration clock. If the signal on OE terminal 27 is determined to be a valid output enable signal, then the signal value on OE pin 27 is utilized to generate an internal output enable control signal 31, which in turn enables (or disables) output drivers 33 that supply the differential clock outputs CLKOUT+ and CLKOUT−.

Control circuit 30 determines whether the signal present on I/O terminal 27 is a valid output enable signal, serial data, or a calibration clock as follows. An internal oscillator clock asynchronously oversamples the OE I/O terminal. Any static value (all samples having the same value) that persists more that a predetermined time period, $t_{STATIC}$, is interpreted as a change to or as a valid enable/disable signal and the output clocks are selectively enabled or disabled based on that static value. The time period $t_{STATIC}$ may be programmable. The sampling circuit functions as a deglitching circuit ensuring that short term changes on I/O terminal 27 do not cause changes to the enable/disable control of the output clock terminal(s).

In order to provide bi-directional data communication via I/O terminal 27, a bi-directional serial data format is utilized that includes guaranteed transitions at less than $t_{STATIC}$ intervals. In one embodiment, the serial data format includes an indication of read or write, the register or other internal address, and direction (either data input or output). Because transitions of the serial communication are guaranteed at less than $t_{STATIC}$ intervals, activity on the OE I/O terminal for serial data I/O will not interfere with the normal enable/disable functionality. In addition, a serial data format is selected that is sufficiently complex, e.g., with appropriate error detection capability, to preclude the possibility that a glitch at the OE terminal during normal operation would be inadvertently interpreted as a serial port command.

In order to distinguish between calibration clocks and serial data, a serial data command is utilized that indicates to the device that the calibration clock will be applied next. That command enables the calibration PLL. After this command, the user supplies the low frequency clock to the OE terminal. The frequency of the calibration clock may be low even though the output frequencies are high due to the use of the divider 37 in the feedback path from the oscillator 39. Note however, that the frequency of the calibration clock should be high enough to provide transitions at less than $t_{STATIC}$ intervals so as not to interfere with the normal enable/disable operation.

The device illustrated in FIG. 3 can function as a voltage-controlled crystal/SAW oscillator (VCXO/VCSO) or a fixed-frequency clock source (XO/SO). A register bit setting may be used to select between the nodes of operation. In voltage-controlled oscillator operational mode the VC analog voltage input port 43 (see FIG. 1) is coupled to the on-chip analog to digital converter (ADC) 45, which is used to convert VC into the digital frequency control word for the DCO. When operating as a fixed-frequency clock source (XO/SO), the ADC 45 is powered down and its output is fixed to its mid-scale value.

Figure 4:
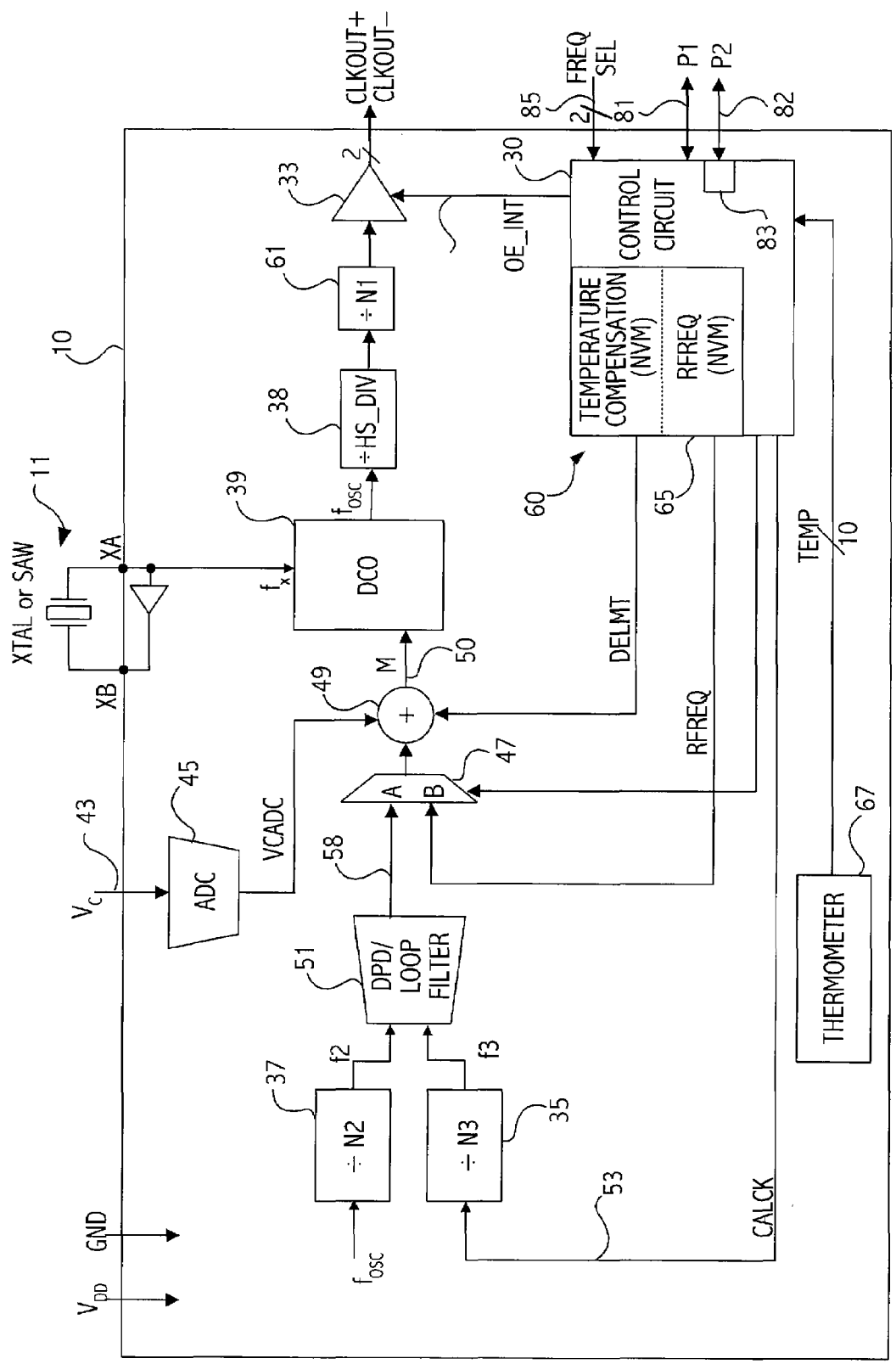
FIG. 4 illustrates an embodiment in which P1 and P2 I/O terminals provide a serial communication terminal for programming and for receiving a configuration clock.

Referring to FIG. 4, in another embodiment the option is provided for using one of two dedicated I/Os on the integrated circuit device. The P1 port 81 is a dedicated I/O that functions as a bidirectional serial port for register data reads and writes, and as a calibration clock input, similar to the function of the OE pin used for programming and calibration described above but without any OE pin functionality. The P2 port 82 is also a dedicated I/O with the same serial bus and calibration clock functionality as P1; however, once programming is completed, P2 can be converted from a dedicated serial port I/O to an input control for the output enable function. Until the dedicated I/O functionality is disabled on P2, there is no output enable pin functionality provided by P2. At the initiation of manufacture test, before the on-chip non-volatile memory (NVM) has been written, either P1 and P2 are able to receive serial bus and calibration clock signals as dedicated I/Os (both should not be used at the same time). At the completion of the manufacture test programming of the various programmable registers, the user may write the programmable register values into non-volatile memory. P2 can then be programmed to function as an output enable control input causing its dedicated programmable I/O functionality to be permanently disabled. That may be accomplished by writing a keyword byte to a programmable register (activate output enable register) to turn on the output enable functionality of the P2 pin and terminate the dedicated serial I/O functionality of the P2 I/O. That may be accomplished using logic gates enabling one function and disabling the other function according to the active output enable register value. P1 always is available to function as a serial and calibration clock port.

Writing the activate output enable register may cause the value to be written into the non-volatile memory (NVM). Alternatively, a specific command may cause the value in the activate output enable register (and other volatile storage) to be written into the NVM. Once the activate output enable register byte has been written into the non-volatile memory (NVM) with the appropriate keyword byte, the P2 I/O functions as the output enable input which controls the state of the clock output buffer. If the NVM is one-time programmable, the change is permanent. On power up or reset, the value in the NVM is loaded into the register to control the function of P2. The active polarity of the P2 I/O when it has been programmed to function as an output enable pin may be controlled by programmable register bits. In addition, register control of the output drivers may be provided. The state of the output driver when disabled (e.g. tristate, hold logic 0, or 1) may also be controlled by register control bits.

Similar to the OE pin described in relation to FIG. 3, an input deglitching circuit 83 guarantees that short term glitches or pulses on the P2 pin are ignored and do not affect the internal buffer disable control. The length of the deglitch interval, also referred to herein as ($t_{STATIC}$) may be programmable via programmable register bits, e.g., by programming the number of consecutive samples required for validation. In one embodiment, the number of samples varies between 1 and 1024. Similar to operation of output terminal 27 described above, all samples of the P2 input should have the same value for the entire duration of the deglitch interval before the state is validated and reflected at the internal buffer control. In one embodiment, the sample clock rate for the deglitch circuit is approximately 10 MHz ($f_{samp}=f_{osc}/512$).

Figure 5:
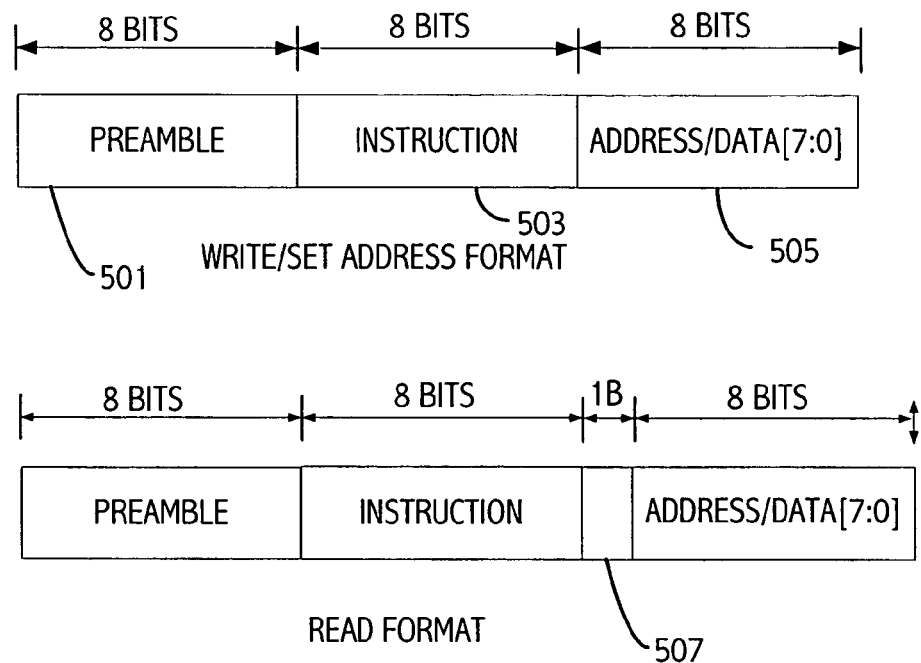
FIG. 5 illustrates exemplary read and write formats utilized for communicating over the serial port.

The serial port is typically used during manufacture test to establish the desired device configuration in the on-chip non-volatile memory (NVM) 60. Serial port communications can begin following a power-on-reset of the device. An exemplary command format for the serial bus is shown in FIG. 5. Each transmission consists of 3 eight bit bytes of data: the preamble byte 501, the instruction byte 503, and the address/data byte 505. One extra clock cycle 507 exists for the Read command in order to allow time for placing the transmit output of the test equipment hooked up to the device in high impedance before the first read bit is sent by the device. The serial port state machine, which may be part of deglitching circuit 83, returns to its initialized condition if any invalid input data is detected or if no activity occurs on the bus. That feature guarantees that the state machine can always be brought to a known condition before signaling begins. In one embodiment, all data sent from the test equipment (master) to the device (slave) is Manchester encoded with a symbol rate of approximately 10 kbps. The Manchester encoding creates guaranteed transitions in the data pattern that are used by the device to determine the master's transmission rate. In an embodiment, read data sent from the device to the test equipment is in a non-return to zero (NRZ) format, which maximizes the available sampling time for the test equipment master. The test equipment master can sample the read data using the same internal clock used to generate the transmit data.

TABLE 2

| BYTE 1 Instruction | BYTE 2 Address/Data[7:0] | Comments |
|---|---|---|
| 00000000 | AAAAAAAA | Set Address |
| 01000000 | DDDDDDDD | Write |
| 01100000 | DDDDDDDD | Write and Increment Address |
| 11000000 | DDDDDDDD | Read |
| 11100000 | DDDDDDDD | Read and Increment Address |
| 10100000 | AAAAAAAA | Read Stored Address Value |
| 10000000 | XXXXXXXX | Reserved |
| 00100000 | XXXXXXXX | Reserved |

Figure 6:
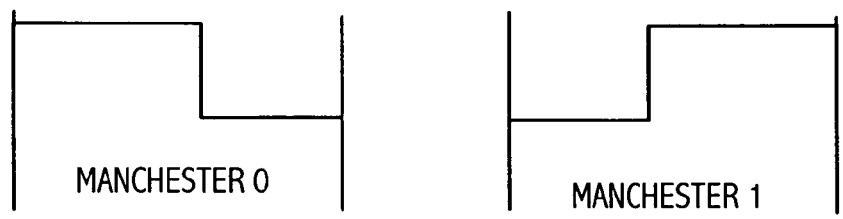
FIG. 6 illustrates exemplary use of Manchester encoding for data supplied over the serial port.
Figure 6:
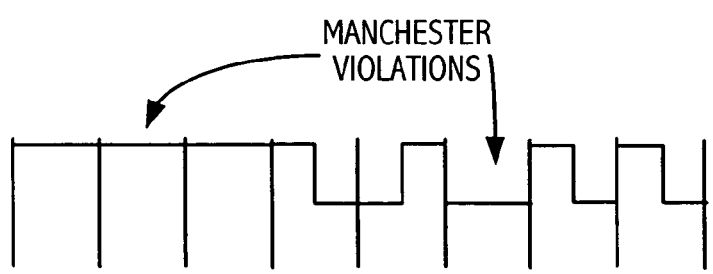

FIG. 6 gives illustrates a Manchester encoded "0" and "1" and also shows the required preamble data pattern. Note that the preamble contains multiple Manchester code violations in order to increase its uniqueness and reduce the chances of false preamble detection.

Referring again to the embodiment illustrated in FIG. 4, the digitally-controlled oscillator (DCO) 39 is driven by a digital frequency control word M and produces a low jitter output clock. The control word M (50) supplied to the DCO 39 is generated by summing a reference frequency control word (RFREQ) with the VCO ADC 45 output (VCADC) and the temperature compensation value (DELMT) in summer 49. The fixed frequency external crystal 11, SAW, or clock provides a low jitter reference needed to synthesize the output clock. In one embodiment frequency synthesis is done digitally, eliminating sensitive noise entry points. In one embodiment, the center frequency of the device is determined by the RFREQ DCO input and the HS_DIV and N1 output divider values.

In one embodiment different calibration approaches with increasing levels of accuracy may be utilized. For some applications, the inherent frequency accuracy and temperature stability of the on-chip crystal oscillator, SAW oscillator, or external reference clock may be sufficient. In this case, no calibration features are needed. A register bit may be used to disable the calibration correction features, in which case the temperature compensation (DELMT) value is forced to mid-scale.

In some applications it may be adequate to perform a one-time characterization of the device with the crystal or SAW type being used, deriving a set of nominal calibration correction factors from this characterization. Following the characterization, these calibration factors may be loaded into the memory of every device without individual calibration. This approach requires some time initially to generate the nominal calibration factors but does not require calibration of each device.

Alternatively, it is possible to individually calibrate each device, generating a unique set of calibration factors for each one. That approach addresses errors due to the performance parameters of each combination of the device and crystal or SAW. The highest level of error reduction is achieved at the cost of increased test time. Individual calibration is most feasible when each device and crystal or SAW is mounted and packaged together and then tested after packaging.

The method for frequency and temperature calibration of the DCO uses an external calibration clock applied at the serial port (the OE pin, P1 or P2). In calibration mode, a digital PLL is implemented around the DCO, locking the DCO output clock to an integer multiple of the low frequency input calibration clock. Once the calibration clock is applied, the device internally generates the required calibration correction factors to generate the desired output frequency.

With reference to FIGS. 3 and 4, calibration according to an embodiment of the invention operates as follows. First the temperature compensation DELMT (delta M over temperature) should be turned off. That forces its contribution to summing node 49 to 0. If desired it may be enabled after the calibration is complete. If the device is being used as a VCO, VCO mode should be enabled and the analog input $V_C$ 43 should be set to its mid-scale voltage during the calibration. That sets the analog to digital converter 45 at midrange. If the device is being used as a fixed frequency oscillator, VCO mode should be disabled to cause the output of the ADC 45 to be at midscale and thus not affect the output frequency. Next the calibration clock frequency range (N3 divider value) 35 should be selected. In one embodiment, there are two possible frequency ranges for the calibration clock. A register bit can be used to select the range from 1 to 2 MHz, (the divider value=1). To select the range from 8 to 16 MHz, the input divider N3 is set to a divider value to 8. The choice of calibration clock frequency range is based on the availability of precision clock sources in the manufacturing test environment. Other embodiments may have different values for the divider block N3 or lack the divider block entirely.

The values for dividers 35 (N3), 37 (N2), high speed divider (HS_DIV) 38 (FIG. 4) and 61 (N1) should be selected along with the calibration clock frequency. The equation relating the calibration clock frequency to the output frequency is as follows for one embodiment of the invention:

$f_{OUT} = f_{CALCK} \times N2/(HS\_DIV \times N1)$ (for N3=1), or $f_{OUT} = f_{CALCK} \times N2/(8 \times HS\_DIV \times N1)$ (for N3=8), where HS_DIV=[4, 5, 6, 7, 9, 11], $1 \leq N1 \leq 2^7$ and N2=256, 512, 1024 Other embodiments may provide other divider values, additional or fewer dividers and thus have different equations for determining the output frequency.

In some embodiments, the calibration loop bandwidth is also selectable. In one embodiment two choices for calibration loop bandwidth are available, which are selected according to a register bit. The wider bandwidth provides faster settling time, but allows more of the calibration clock phase noise to affect the absolute frequency accuracy when the DPLL is frozen. The lower bandwidth has slower settling, but less variation in the absolute frequency value when the DPLL is frozen. The optimal choice is a function of the calibration clock jitter and the absolute frequency accuracy requirement for the application.

Figure 7:
FIG. 7 illustrates exemplary use of a calibration clock over the serial port.
Figure 7:

Referring to FIG. 7, the control circuit 30 then receives a command setting the calibration clock on (CCK_ON) register bit to one through a serial port register write, indicating that a calibration clock is to be supplied over the serial port (input/output terminal 27, P1, or P2). Subsequently, the calibration clock can be supplied as an input frequency reference for the calibration PLL. FIG. 7 illustrates a command sequence including a preamble, write command and data followed by application of the calibration clock. In response to the write command, the control state machine selects multiplexer input A from the digital phase detector and loop filter 51, which forms a phase-locked loop with DCO 39 in this configuration. The calibration clock (CALCK) is supplied via node 53 to the divider circuit 35. The digital phase detector and loop filter 51 detects the phase/frequency difference between the calibration clock and the output of the DCO 39 and provides a correction signal 58 to summer 49 through multiplexer 47 to adjust the control signal M supplied to the DCO 39 to reflect that difference. The calibration clock is applied for sufficient amount of time to allow the PLL to settle and establishing the correction factors needed to lock the DCO 39 output clock to an integer multiple of the low frequency input calibration clock. In other embodiments the DCO may lock to a fractional multiple (e.g., a ratio or integers) of the calibration clock according to the dividers utilized. Note that because of the divider 37 in the feedback path of the PLL, the calibration clock can be a low frequency signal even for those devices with high speed output clocks. Note that control operations during calibration, e.g., to select the multiplexer input and store the value of M, may be controlled via commands sent to serial port, the result of internal control generated by, e.g., a state machine in control circuit 30, or both.

Once the PLL is locked and settled the calibration clock is stopped as shown in FIG. 7. That causes the internal state of the device to be stored and the CCK_ON bit is automatically reset to zero. The cessation of the clock is detected by the control circuit 30 causing it to freeze the correction values internally. If the delay required to detect the cessation of the clock allows the PLL to be disturbed before the correction values are stored, a history of the correction values can be kept on-chip and the correction values that existed before the actual clock cessation can be kept. The correction values that are stored may be the correction factor generated by the phase detector and loop filter 51 or the value of M when the PLL is locked to the calibration clock (essentially the same as the correction factor but after the summing node 49). To avoid any inaccuracies in the frozen register values due to the loss of clock detection delay, a running history of the values is kept and the values that existed immediately before the loss of clock are stored when the PLL is frozen. The running history may be stored in registers in the control circuit 30. The correction value(s), along with appropriate divider values, can be stored in the non-volatile memory 60, which may, e.g., be implemented as an EPROM, EEPROM, or any other suitable non-volatile memory. The correction value is used to generate the control value supplied to the DCO 39 by supplying the correction value to summing node 49 during normal operation.

In one embodiment a lock detection mechanism is included for the calibration PLL. A lock detect bit (LOCK) is the result of an analysis of the PLL phase detector output. A retriggerable one-shot is set each time the phase detector output indicates a full-scale condition (phase cycle slip). The retrigger time of the one-shot may be programmable via a register bit. Therefore, if no cycle slip has occurred for the retrigger time, the internal lock detection indicator bit (LOCK) is set to one, indicating that the PLL is in lock. The internal lock detection indicator bit (LOCK) can be queried to verify that the PLL achieved lock during the time the calibration clock was active.

Once the calibration clock has ceased for a sufficient amount of time defined by a predetermined time period, the internal over sampling state machine returns to its reset or initialization state, waiting for further activity on OE, P1 or P2, and ready to receive additional commands. This timeout feature prevents lockup of the state machine, guaranteeing a known starting condition for the user.

Note that the serial communication capability available through input/output terminal 27 also allows a user to program a fixed control value to set oscillator 39 to a specific output frequency by writing to frequency tune storage location 65 (referred to as RFREQ in FIG. 4), supplying that value to multiplexer 47 and selecting the B input of multiplexer 47 to be supplied to summing node 49. Additionally, the divider ratios in any or all of divider blocks 35, 37, 38 and 61 may be written and/or read via the serial port provided by input/output terminal.

Note that calibration can also be performed without a calibration clock input. However, that requires multiple serial data writes to the device to set the correction factor supplied, e.g., through summing node 49 so that while the control voltage $V_c$ is centered, the clock out signal matches an external calibration clock. By instead using a calibration clock supplied over the serial port, the device can itself find the desired correction value by locking its PLL to the calibration clock.

The on-chip non-volatile memory (NVM) 60 provides for permanent storage of device configuration settings and calibration settings at manufacture. The NVM memory space includes bits for all of the settings necessary to fully configure the device. The volatile memory space includes duplicate bits for each NVM bit, plus additional bits tat do not require non-volatile storage. In one embodiment, the non-volatile memory is one time programmable. A primary (M1) and secondary (M2) NVM space are provided to allow the NVM settings to be written twice during the lifetime of the device. A status register may be used to indicate the current status of M1 and M2. Data is written from volatile memory, such as registers, into NVM using the STORE command. All volatile memory bits with duplicates in the NVM space are written with one command. The first time the STORE command is executed, the M1 NVM space is written. When the write is initiated, a status bit (M1_WR) is permanently set. Once the write is completed, STORE is reset to zero, a read of M1 is done, and the result is compared to the volatile memory settings. If there is a match, then the NVM write has been successful and the M1_CHK status bit is permanently set. The next time the STORE command is executed, the M2 NVM space will be written. After device powerup or reset, the NVM status bits are checked and the appropriate NVM memory space downloaded into the volatile memory. The appropriate NVM space may also be downloaded on command using the RECALL register bit. Once the download is complete, RECALL is reset automatically.

Upon power up, the device internally executes a power on-reset (POR) which resets the internal device logic, loads the various setting stored in the non-volatile memory into volatile memory (e.g. the various control registers), and places the device output into high impedance. A register bit may also be used to initiate a reset.

As stated above, in one embodiment, the center frequency of the device is determined by the RFREQ DCO input and the HS_DIV and N1 output divider values. In one embodiment the device has the capability of storing four unique sets of RFREQ, HS_DIV, and N1 values representing four unique selectable output frequencies. There need not be a relationship between the four frequencies desired. This feature is useful in applications where a different output frequency is required depending on the system configuration. The FRQSEL[1:0] inputs 85 select which set of RFREQ, HS_DIV, and N1 values are used. If this feature is not desired, the FRQSEL[1:0] pins can be left floating, in which case default values are selected.

Note that the devices illustrated in FIGS. 3 and 4 provide temperature compensation. That compensation is achieved by supplying the appropriate compensation value from non-volatile memory 60 based on the temperature detected by thermometer 67. Calibration for temperature compensation involves generating digital correction factors for various temperatures of interest.

In one embodiment temperature compensation values are determined as follows. First a reference temperature point is determined. The calibration at this temperature sets the RFREQ value to the DCO and all other temperature/frequency points are calculated with respect to this reference point. The reference temperature does not have to be the nominal ambient temperature of operation. To establish the reference temperature calibration point, a temperature calibration point register (TCP[2:0]) is set to 000, FRQSEL[1:0]=11 (if that feature is provided), and the device is brought to the desired reference temperature. The calibration clock is then applied through the P1 or P2 pin. When the clock is stopped, the M value corresponding to the frozen frequency and the temperature value are stored in the RFREQ_11 and RTEMP RAM registers, respectively. The stored values of M and the temperature are the values that existed immediately before the clock was stopped to avoid any glitches that might occur after the calibration clock is stopped.

To generate the calibration points across temperature, after establishing the reference temperature calibration point, TCP[2:0] is set to 001 to indicate the next temperature calibration point is being established, and FRQSEL[1:0] is set to 11, and the device is brought to the desired temperature. The calibration clock is applied as described previously. When the clock is stopped, the frozen delta-frequency value (relative to RFREQ_11) is stored in the DELMT1 register. The frozen delta-frequency value=(M at the reference temperature)−(M at the next temperature calibration point). The associated temperature is stored in the TEMP1 register. For each additional temperature calibration point, the temperature calibration point register is incremented and the calibration clock is reapplied at the desired temperature, and the new frozen delta-frequency value is stored along with the corresponding temperature. The temperature and delta M values are subsequently stored in non-volatile memory. During operation the M value at the reference temperature is used when the thermometer 67 indicates the reference temperature and appropriate offsets (supplied as DELMT) are supplied according to the temperature detected by thermometer 67. In other embodiments, the value of M at the particular temperature is stored, rather than delta M, and that value is supplied for temperature compensation.

In one embodiment the device can store up to six calibration points (frequency and temperature pairs), including the reference point, to calibrate the device across temperature. In normal operation with the temperature compensation feature turned on, the device interpolates between the provided calibration points using a polynomial of order N−1, where N is the number of calibration points to be used, which in one embodiment is programmable using register bits. For example, if values are written into RFREQ_11, DELMT1, DELMT2, and DELMT3 while DELMT4 and DELMT5 are not to be used, the user sets N=4 so that a 3rd order polynomial interpolation is used.

As illustrated in FIG. 4, and described above a multi-frequency feature is available using the frequency select inputs FREQSEL[1:0]. If the multi-frequency feature is used, temperature calibration for the additional frequencies is achieved by holding the device at the reference temperature, setting FREQSEL[1:0]=10, and reapplying the calibration clock at the appropriate frequency. When the clock is stopped, the frozen frequency control value is stored in RFREQ_10. If a third and fourth frequency are desired, repeat the above procedure with FRQSEL[1:0]=01 and 00, respectively.

Figure 8:
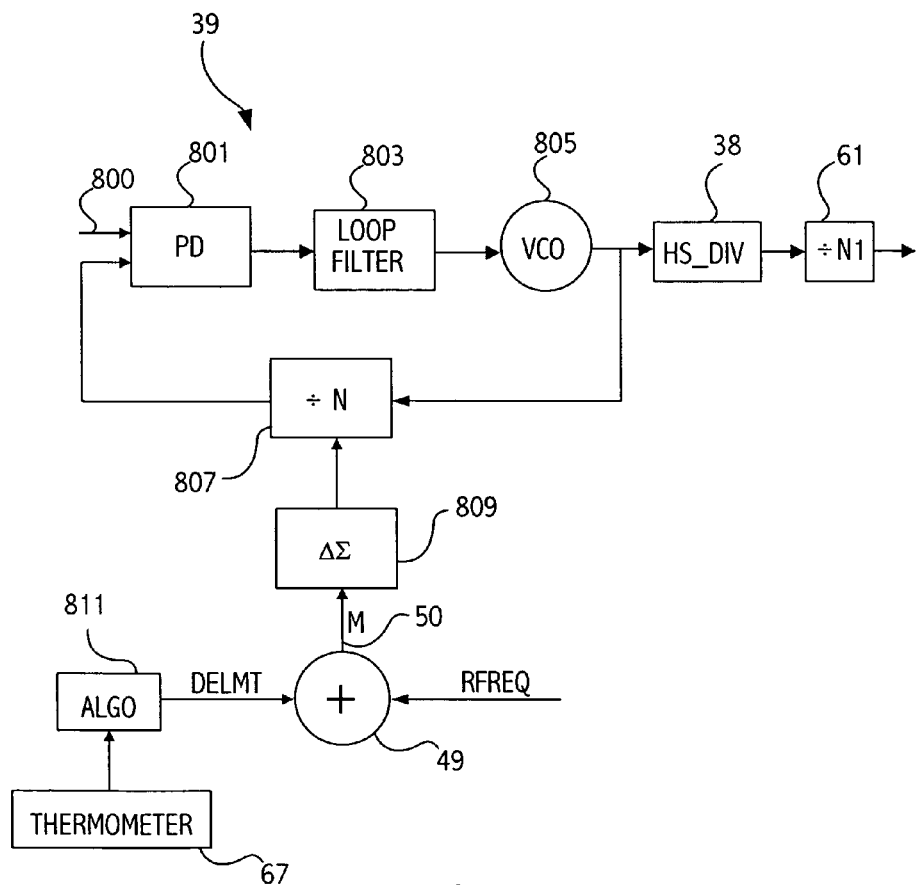
FIG. 8 illustrates an exemplary embodiment of the digitally controlled oscillator utilized in FIGS. 3 and 4.

Referring to FIG. 8, illustrated is an exemplary embodiment of the digitally controlled oscillator (DCO) 39. The crystal (or SAW) oscillator 11 (not shown in FIG. 8) provides one input 800 to the phase and frequency detector 801. Phase and frequency detector 801 generates an error term of the difference between the input 800 to PD 101 and the feedback from the VCO 805 supplied by the divide-by-N block 807. In the embodiment illustrated in FIG. 8, the DCO is a fractional-N frequency synthesizer in which the control value M (control value 50 in FIG. 4) is supplied to a delta sigma modulator 809, which in turn is used to adjust the value of N in the multi-modulus divide-by-N block 807 in the feedback loop of the DCO 39.

In order to additionally compensate for temperature variations, which affect the reference frequency supplied, e.g., by the XO, the delta M over T value (DELMT) value is supplied to summer 49 along with the reference frequency control value RFREQ. Thus, the control value generated at the reference temperature calibration point, along with an interpolated delta as described above, is supplied to summer 49 and utilized to generate the M value. Note that other temperature calibration algorithms besides the interpolation described above may be implemented in the algorithm block 111. That function, in the embodiment illustrated in FIG. 4, is performed by the control circuit 30. Thus, the temperature compensation is achieved by adjusting the feedback loop of the DCO 39 through the delta sigma modulator 109 coupled to adjust the divisor value in the divide block 107.

In one embodiment, the divide-by-N block 807 is formed by a series of dividers. Because the feedback frequency may be in the giga Hertz range, a prescalar is used to divide the feedback signal by, e.g., 4 or 5. Subsequent division stages, e.g., a plurality of divide by 4 and/or 5 stages further divide the feedback signal to an appropriate value according to the desired divider value.

Assume for example, that the value of M is 100. The temperature compensation value determined by the interpolation described above may cause the value of M with temperature compensation to be 100.5. The delta sigma modulator in one embodiment provides an output having 8 different integer levels from −3 to 4, to represent the fractional portion, which values are combined with the integer portion (100) and mapped into the series of dividers in divide by N block 807. Thus, values ranging from 97 to 104 may be applied as divider values to the multi-modulus divide by N block 807. The use of the delta sigma modulator allows appropriate values to be used to average 100.5. Note that a value is generated by the divide by N block 807 at a rate of the XO (or other reference) clock frequency supplied on node 800. Note also that noise shaping may be used to place any noise generated in the feedback divider in a frequency band that may be subsequently filtered by a low pass filter in the loop filter 803.

Thus, various embodiments have been described for calibrating and utilizing a clock device. The description of the invention set forth herein is illustrative, and is not intended to limit the scope of the invention as set forth in the following claims. For example, while a PLL has been described other control loops, such as a frequency locked loop may be utilized to generate appropriate correction values to calibrate the oscillator. Other variations and modifications of the embodiments disclosed herein, may be made based on the description set forth herein, without departing from the scope and spirit of the invention as set forth in the following claims.

What is claimed is:

1. A method comprising:
   receiving a calibration clock over a terminal;
   generating at least one control value in a control loop to lock a clock generated by a controllable oscillator to a multiple of the calibration clock; and
   storing a value corresponding to the at least one control value in a non-volatile memory.

2. The method as recited in claim 1 wherein the control loop is a phase-locked loop.

3. The method as recited in claim 2 further comprising generating at least a second control value using the phase-locked loop to lock the clock generated by the controllable oscillator to a multiple of the calibration clock and wherein the at least one control value and the second control value are generated at first and second temperatures.

4. The method as recited in claim 3 further comprising storing the first and second temperatures in the non-volatile memory.

5. The method as recited in claim 3 further comprising storing a difference between the at least one control value at the first temperature and the second control value at the second temperature.

6. The method as recited in claim 2 further comprising determining if the phase-locked loop is locked to the calibration clock during receipt of the calibration clock.

7. The method as recited in claim 1 wherein the multiple is one of an integer multiple and fractional multiple of the calibration clock.

8. The method as recited in claim 1 further comprising supplying a fixed frequency reference from a fixed frequency reference source to synthesize the clock.

9. The method as recited in claim 8 wherein the fixed frequency reference source is one of a crystal and a surface acoustic wave (SAW) device.

10. The method as recited in claim 8 further comprising receiving the calibration clock while the non-volatile memory, fixed frequency reference source and the phase-locked loop are in a sealed package.

11. The method as recited in claim 1 further comprising receiving at least one command sequence over the terminal prior to receiving the calibration clock.

12. The method as recited in claim 11 wherein the at least one command sequence programs a storage location and determines a divider value utilized by a divider circuit in the phase-locked loop according to a value in the storage location.

13. The method as recited in claim 11 wherein the terminal is bidirectional and a serial command received over the terminal is a read command causing data to be provided on the terminal.

14. The method as recited in claim 2 further comprising selectively coupling the controllable oscillator to a feedback path to form the phase-locked loop.

15. The method as recited in claim 1 wherein the controllable oscillator is supplied a digital control value.

16. The method as recited in claim 1 further comprising setting a voltage control input to midrange prior to providing the calibration clock.

17. The method as recited in claim 1 further comprising disabling a voltage controlled crystal oscillator (VCXO) mode of operation prior to providing the calibration clock.

18. The method as recited in claim 1 further comprising disabling a temperature compensation mode of operation prior to providing the calibration clock.

19. A method of calibrating a device that includes a controllable oscillator and a resonating device that supplies a fixed reference frequency used by the controllable oscillator to synthesize an output clock, the controllable oscillator and the resonating device being mounted in a package, the method comprising:
supplying a calibration clock to an input/output terminal of the device;
generating a control value in a control loop of the device to cause the controllable oscillator to lock to a multiple of the calibration clock; and
storing a value determined according to the control value in a non-volatile memory in the device.

20. The method as recited in claim 19 wherein a phase-locked loop is selectively implemented as the control loop and includes the controllable oscillator and generates the control value during calibration.

21. The method as recited in claim 19 wherein the resonating device is one of a crystal and a surface acoustic wave (SAW) device.

22. The method as recited in claim 19 further comprising receiving at least one command sequence over the input/output terminal prior to receiving the calibration clock.

23. The method as recited in claim 22 wherein the at least one command sequence determines a divider value utilized by a divider circuit in a phase-locked loop generating the control value during calibration, the divider value being determined according to a value in the storage location.

24. An apparatus comprising:
a controllable oscillator coupled to receive a reference frequency and a control value and to output a clock signal;
a terminal for receiving a calibration clock signal;
a phase-locked loop circuit including the controllable oscillator is coupled to receive the calibration clock signal and generate a correction factor to cause the controllable oscillator to lock to a multiple of the calibration clock signal; and
a non-volatile memory storing a value corresponding to the correction factor.

25. The apparatus as recited in claim 24 wherein the controllable oscillator is selectively coupled as part of the phase-locked loop.

26. The apparatus as recited in claim 24 further comprising memory locations storing a history of correction factors determined during calibration of the apparatus.

27. The apparatus as recited in claim 24, wherein the apparatus is further coupled to respond to input signals on the terminal as serial commands.

28. The apparatus as recited in claim 24 wherein the apparatus is an integrated circuit.

29. The apparatus as recited in claim 24 wherein the terminal is a pin on a package holding a semiconductor device.

30. The apparatus as recited in claim 24 wherein the terminal is bi-directional.

31. The apparatus as recited in claim 24, further comprising an integrated circuit including a control circuit coupled to determine when the terminal has had a particular value for longer than a predetermined time period, and to supply an internal output enable signal having the particular value to selectively enable the one or more clock signals according to the particular value.

32. The apparatus as recited in claim 31 wherein transitions on the terminal that occur in less than the predetermined time period are determined to be serial data communication signals.

33. The apparatus as recited in claim 24, further comprising an integrated circuit including the controllable oscillator and the phase-locked loop circuit.

34. The apparatus as recited in claim 33 wherein the apparatus includes a resonating device supplying the reference frequency and a package holding the resonating device and the integrated circuit.

35. The apparatus as recited in claim 34 wherein the resonating device is one of a crystal and a surface acoustic wave (SAW) device.

36. The apparatus as recited in claim 24 wherein a serial command sent to the input terminal is utilized to communicate to the apparatus that the calibration clock is going to be supplied.

37. The apparatus as recited in claim 34 wherein the package is a ceramic package.

38. The apparatus as recited in claim 31 wherein when the terminal is used as a serial data port, data transitions on the terminal occur at less than the predetermined interval and the data transitions do not change a current value of the internal output enable signal.

39. The apparatus as recited in claim 38 wherein the serial data port is bi-directional.

40. An apparatus comprising:
a terminal for receiving a signal;
a resonating device supplying a reference signal having a fixed frequency;

a controllable oscillator coupled to receive the reference signal and generate a clock signal;

means for calibrating the apparatus utilizing a calibration clock supplied on the terminal by internally generating, in a phase-locked loop, one or more control values for the controllable oscillator to cause the oscillator to output a signal corresponding to the calibration clock; and a non-volatile storage storing one or more values corresponding to the one or more control values.

41. The apparatus as recited in claim 40 wherein the apparatus comprises an integrated circuit and a resonating device in a sealed package.

42. The apparatus as recited in claim 40 wherein the means for calibrating further generates at least a second control value using the phase-locked loop to lock the clock generated by the controllable oscillator to a multiple of the calibration clock and wherein the one control value and the second control value are generated at first and second temperatures.

43. The apparatus as recited in claim 42 wherein the first and second temperatures are stored in the non-volatile storage.

44. The apparatus as recited in claim 42 wherein a difference between the at least one control value at the first temperature and the second control value at the second temperature is stored in the non-volatile storage.

45. The method as recited in claim 19 further comprising:
generating a second control value using the control loop to lock the clock generated by the controllable oscillator to a multiple of the calibration clock, wherein the control value and the second control value are generated at first and second temperatures; and storing a second value associated with the second control value in the non-volatile memory.

46. A device including an integrated circuit calibrated according to the method of claim 45.

* * * * *